United States Patent [19]
Sonego et al.

[11] Patent Number: 5,994,231
[45] Date of Patent: Nov. 30, 1999

[54] PROCESS FOR DEPOSITING A STRATIFIED DIELECTRIC STRUCTURE FOR ENHANCING THE PLANARITY OF SEMICONDUCTOR ELECTRONIC DEVICES

[75] Inventors: Patrizia Sonego; Elio Colabella; Maurizio Bacchetta, all of Milan; Luca Pividori, Turin, all of Italy

[73] Assignee: SGS-Thomson Microelectronics S.R.L., Milan, Italy

[21] Appl. No.: 08/996,920

[22] Filed: Dec. 23, 1997

[30] Foreign Application Priority Data

Dec. 24, 1996 [EP] European Pat. Off. .............. 96830645

[51] Int. Cl.⁶ ................................................. H01L 21/4763
[52] U.S. Cl. .......................... 438/706; 438/778; 438/723; 438/787
[58] Field of Search ..................... 438/697, 699, 438/706, 723, 712, 710, 778, 781, 784, 787, 788

[56] References Cited

U.S. PATENT DOCUMENTS

| | | | |
|---|---|---|---|
| 5,290,399 | 3/1994 | Reinhardt ................................. | 438/697 |
| 5,554,567 | 9/1996 | Wang ....................................... | 438/697 |
| 5,618,757 | 4/1997 | Bothra et al. ........................... | 438/697 |
| 5,679,211 | 10/1997 | Huang ..................................... | 438/697 |
| 5,681,425 | 10/1997 | Chen ....................................... | 438/697 |
| 5,747,381 | 5/1998 | Wu et al. ................................ | 438/699 |

FOREIGN PATENT DOCUMENTS

| | | |
|---|---|---|
| 0389 028 | 9/1990 | European Pat. Off. . |
| 0498 521 | 8/1992 | European Pat. Off. . |
| 0389028A2 | 9/1990 | Italy .............................. H01L 21/90 |

OTHER PUBLICATIONS

Patent Abstracts of Japan for Patent #JP04030524 published Feb. 3, 1992 at vol. 16, No. 200, May 13, 1992.

"Spin–on Glass Curing by Rapid Thermal Annealing," *Journal of the Electrochemical Society*, vol. 137, No. 12, pp. 3923–3925, Dec. 1, 1990.

*Primary Examiner*—Benjamin Utech
*Assistant Examiner*—DuyVu Deo
*Attorney, Agent, or Firm*—Jenkens & Gilchrist, P.C.

[57] ABSTRACT

A method of depositing a layered dielectric structure to improve the planarity of electronic devices which include a plurality of active elements having gate regions laid across the substrate as discrete parallel lines, such as the bit lines of memory cells. The bit lines are isolated from one another by a layered dielectric structure to provide a planar architecture onto which an optional conductive layer may be deposited. The dielectric structure is formed from a highly planarizing dielectric layer of the SOG type spun over a first insulating dielectric layer and solidified by means of a thermal polymerization process. After solidifying the dielectric layer, it is subjected to a rapid thermal annealing treatment.

8 Claims, 5 Drawing Sheets

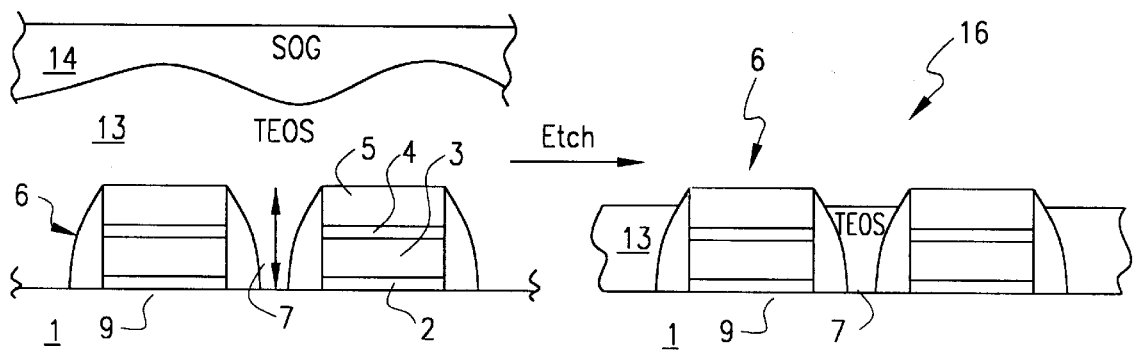
(PRIOR ART)
*FIG. 6A*
(PRIOR ART)
*FIG. 6B*
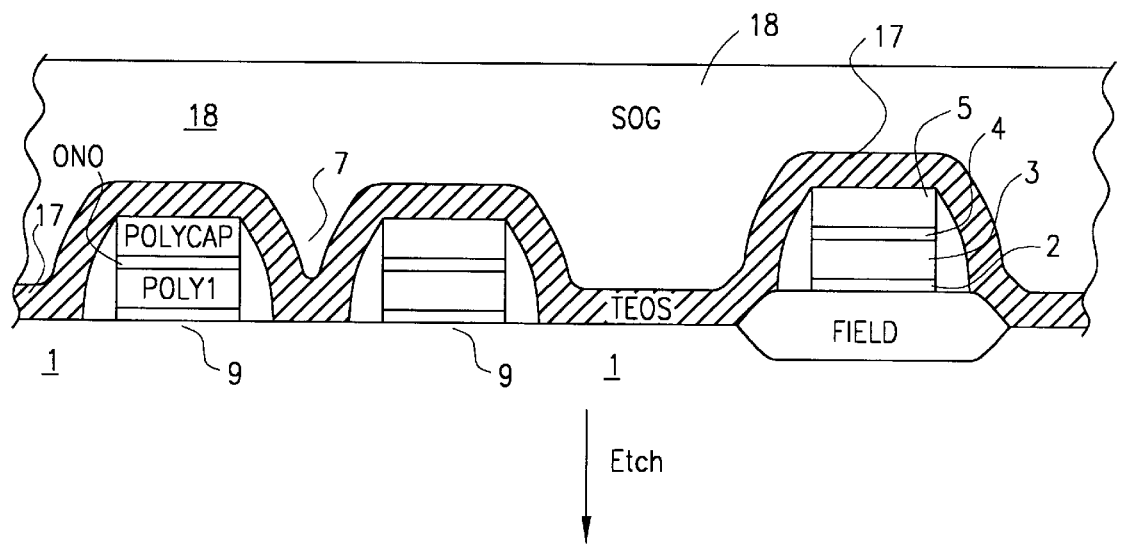
*FIG. 7A*
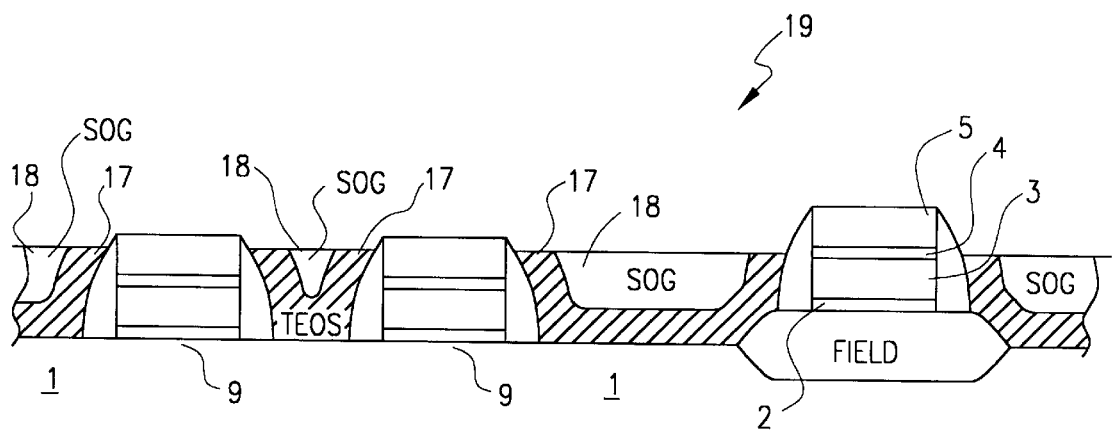
*FIG. 7B*

PROCESS FOR DEPOSITING A STRATIFIED DIELECTRIC STRUCTURE FOR ENHANCING THE PLANARITY OF SEMICONDUCTOR ELECTRONIC DEVICES

FIELD OF THE INVENTION

This invention relates to a method of depositing a layered dielectric structure to improve the planarity of electronic devices integrated on a semiconductor substrate.

BACKGROUND OF THE INVENTION

As is well known, the fabrication of integrated electronic devices on semiconductor substrates often requires that the circuit patterns be checked for critical architectures which might impair a reliable operation of the formed components.

In particular, this test is necessary where a conductive layer is to be deposited onto a surface less than truly planar, having local discontinuities or depressions. In fact, the conductive layer of the latest deposition, due to low conformability of the deposited film, may have its cross-section reduced in size so that in some cases mechanical breaks occur producing loss of electrical continuity.

A typical instance is that of a plurality of active elements, whose gate regions extend across the substrate as discrete parallel lines, e.g. in the form of floating gate lines, which require reduction to a planar type architecture for receiving, as by deposition, an overlying conductive layer. On analyzing a vertical cross-section of the semiconductor substrate under an electronic microscope, a typical square-wave profile can be observed, as shown in FIG. 1. This profile is obviously unsuitable to receive a deposition of conductive material thereon. To effect a subsequent deposition of a conductive layer, the cross-section profile must be made less "discontinuous."

Merely as an example, consider an instance where a plurality of floating gates are to be intersected orthogonally by a plurality of strips of a conductive material to define a topography of the matrix type, that is a typical structure of semiconductor memory circuits such as those including EPROM or E²PROM memory cells. The plurality of parallel lines including the floating gates will be referred to as the "bit lines", and the plurality of conductive strips referred to as the "word lines," hereinafter. FIG. 2 illustrates a plurality of EPROM memory cells under an electronic microscope having a matrix-like topography resulting from intersecting bit and word lines. It is a recognized fact, in this particular application, that conductive layers deposited over semiconductor substrates tend to distribute themselves unevenly across the substrate, thereby developing discontinuous profiles wherein areas of substantial thickness alternate with areas of diminishing thickness. The more pronounced this feature is, the more discontinuous the cross-sectional semiconductor profile will be.

Shown in FIGS. 3 and 4 is a perspective view of a semiconductor substrate having a plurality of bit lines 6 integrated thereon which are laid parallel to and at a spacing from one another. The bit lines 6 may include EEPROM and FLASH EPROM memory cells when orthogonally intersected at the top by a plurality of parallel spaced conductive strips 12 as shown in FIG. 4. This plurality of conductive strips 12 are customarily referred to as the word lines. Conductive strips 12 may include a first layer 10 and a second layer 11.

Each bit line 6 deposited over the semiconductor substrate 1, at predetermined areas thereof, comprises:

a first thin oxide layer 2 referred to as the tunnel or gate oxide;

a second layer 3 of polysilicon, also referred to as the polyl;

a third, insulating layer 4, typically of ONO (Oxide-Nitride-Oxide); and a fourth layer 5 of polysilicon, also referred to as the poly cap.

Thus, a circuit architecture 9 is formed on substrate 1 which includes bit lines 6 and word lines 12 to provide, for example, EPROM or FLASH memory cells. Voids 7 are formed between bit lines 6.

The deposition areas of the conductive layer where thickness is the smallest are susceptible to mechanical breaks that destroy the electrical continuity of the layer. In addition, another drawback shows up when the plurality of regions or voids 7 in the semiconductor substrate 1, bounded by the bit lines 6, must be isolated electrically from the overlying conductive layer. In fact, if the substrate is isolated by silicon oxide, the oxide thermal growth may reveal diminishing thickness at the edges of the bit line 6 forming a topography which is difficult to cover in conformal way by the conductive layer.

As to the word lines 12, these are conventionally formed from the deposited conductive layer defined by photolithographic and either wet or dry etching operations.

FIG. 5 is an enlarged scale view obtained from a photograph taken by an electronic microscope showing a vertical cross-section through a semiconductor substrate integrating a plurality of bit lines which are isolated from one another by a deposition of dielectric oxide and are covered with a conductive layer. This figure highlights another drawback which is typically associated with the deposition of the conductive layer. This drawback is noticeable in the black area at the top of the picture. The black area actually shows narrower portions near a white area identifying the oxide layer which separates the bit line from the conductive layer. These narrower portions may cause short circuits between active regions of the semiconductor substrate beneath the bit lines and word lines.

It should also be noted that the topographic definition of the word lines, as obtained by photolithographic and either wet or dry etching operations performed on the conductive layer, can cause deformations in the floating gates as a result of the reiterative flushing involved to thoroughly remove the conductive layer from the regions not protected by a resist.

A first known proposal for planarizing semiconductor substrates with a plurality of floating gates is disclosed in European Patent Application 0 573 728 entitled "Processo EPROM a tovaglia" ("A Tablecloth EPROM Process") filed by S. Mazzali, M. Melanotte, L. Masini, M. Sali in 1989. The method disclosed in this document is illustrated in FIGS. 6A and 6B. Reference numerals in FIGS. 6A and 6B which are like, similar or identical to reference numerals in FIGS. 1 and 2 indicate like, similar or identical components. This method includes isolating the plurality of floating gates from one another by depositing a first dielectric layer 13 of the TEOS (TetraEthylOrthoSilicate) type. The thickness of the deposited TEOS layer 13 is quite substantial, being illustratively three times as great as the step between the substrate 1 and the upper end of the bit lines 6. A second dielectric layer 14 of the SOG (Spin-on Glass) type is then deposited over the first dielectric layer to planarize the surface of the semiconductor substrate. This deposition process includes a preliminary spinning step or step of spreading a highly viscous liquid material such as a SOG gel, followed by a solidification step using thermal polymerization treatments at a temperature in the 400° C. range, for example. Thereafter, the planarized surface is subjected to selective etching in the respect of the polysilicon, in order to thoroughly remove the SOG dielectric layer 14 and confine the TEOS layer 13 to the voids 7 between the plural floating gates to form an electronic device 16 as illustrated in FIG. 6B.

However, this proposed approach has the serious drawback of requiring wet or dry etching steps to remove the excess insulating dielectric. These steps do etch away some of the originally substantial thickness of the TEOS dielectric, but also deteriorate the planarity previously achieved through the deposition of the SOG type of dielectric layer because of the different etching selectivity between TEOS and SOG. The deposition of dielectric layers of the TEOS type, especially thick ones, is always accompanied, in fact, by the formation of micro-voids or cracks from the deposition process itself (in particular the covering step) and stresses within the deposited material, whereby undesired contacts may be established between contiguous deposited layers.

The above observation is confirmed in an article "Planarized $SiO_2$ Interlayer Formed by Two Step $O_3$/TEOS APCVD and Low Temperature Annealing" by Koji Kishimoto, Mieko Suzuki, Takeshi Hirayama, Yasuo Ikeda, and Youichirou Numasawa of NEC Corporation, Jun. 9–10, 1992, page 150, line 10, emphasizing the impossibility of using TEOS-type dielectric layers of substantial thickness, since they represent a source of mechanical failure which can only be avoided by adopting more elaborate growth methods.

Thus, what is needed is a method of depositing a layered dielectric structure, effective to promote planarization of a semiconductor substrate laid with a plurality of spaced bit lines, so as to accommodate the optional deposition of an overlying conductive layer while overcoming the aforementioned limitations and drawbacks besetting the prior art.

SUMMARY OF THE INVENTION

Accordingly, the present invention provides a method of depositing a layered dielectric structure to improve the planarity of electronic devices integrated on a semiconductor substrate, which devices include a plurality of active elements having gate regions laid across the substrate as discrete parallel lines, the lines being isolated from one another by a first dielectric layer which also fills voids therebetween. The method includes the steps of applying a second planarizing dielectric layer of spin-on glass (SOG), solidifying the second dielectric layer by thermal polymerization treatments, and following the solidification step, etching and densifying the second dielectric layer with one of a rapid thermal annealing (RTA) treatment or an annealing treatment in an oven.

The present invention provides an alternative method of depositing a layered dielectric structure to improve the planarity of electronic devices integrated on a semiconductor substrate, which devices include a plurality of active elements having gate regions laid across the substrate as discrete parallel lines. This method includes the steps of growing a first layer of dielectric oxide in the substrate regions between the lines, dispersing or spinning from a liquid phase a highly viscous material, containing silicon oxides and organic radicals, to form a second planarized dielectric layer, solidifying the second dielectric layer by thermal polymerization treatments, selectively etching away the second dielectric layer, and densifying said second dielectric layer by one of a rapid thermal annealing treatment or an annealing treatment in an oven.

Additional objects, advantages, novel features of the present invention will become apparent to those skilled in the art from this disclosure, including the following detailed description, as well as by practice of the invention. While the invention is described below with reference to preferred embodiment(s), it should be understood that the invention is not limited thereto. Those of ordinary skill in the art having access to the teachings herein will recognize additional implementations, modifications, and embodiments, as well as other fields of use, which are within the scope of the invention as disclosed and claimed herein and with respect to which the invention could be of significant utility.

BRIEF DESCRIPTION OF THE DRAWINGS

The features and advantages of the inventive method will be apparent form the following description of an embodiment thereof, given by way of non-limitative example with reference to the accompanying drawings.

FIGS. 6A and 6B show schematically, to an enlarged scale, a vertical cross-section through a semiconductor electronic device during a step of depositing a planarized dielectric layer from a TEOS-SOG layered dielectric structure, according to the prior art.

FIGS. 7A and 7B show schematically, to an enlarged scale, a vertical cross-section through a semiconductor electronic device during a step of depositing a TEOS-SOG layered dielectric structure, in accordance with a method of the present invention.

FIGS. 10A and 10B show schematically, to an enlarged scale, a vertical cross-section through a semiconductor electronic device during a step of depositing a SOG dielectric structure, in accordance with an alternate method of the present invention.

DETAILED DESCRIPTION OF A PREFERRED EMBODIMENT OF THE INVENTION

Figure 1:
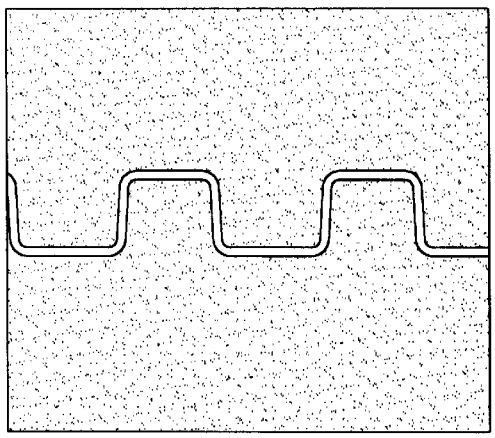
FIG. 1 is derived from a photograph, taken by an electronic microscope, of the profile of a prior art semiconductor substrate having plural bit lines integrated thereon.
Figure 2:
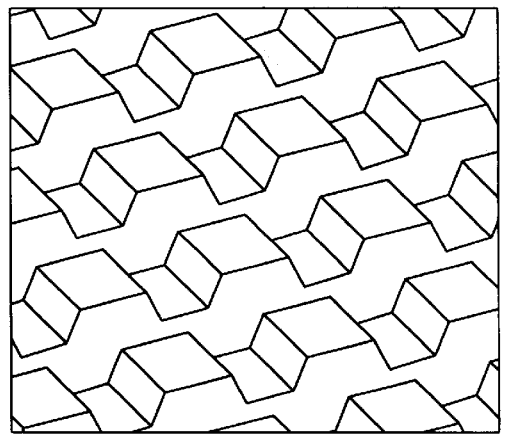
FIG. 2 is derived from a photograph, taken by an electronic microscope, of a prior art plurality of EPROM memory cells having a matrix-like topography resulting from intersecting bit and word lines.
Figure 3:
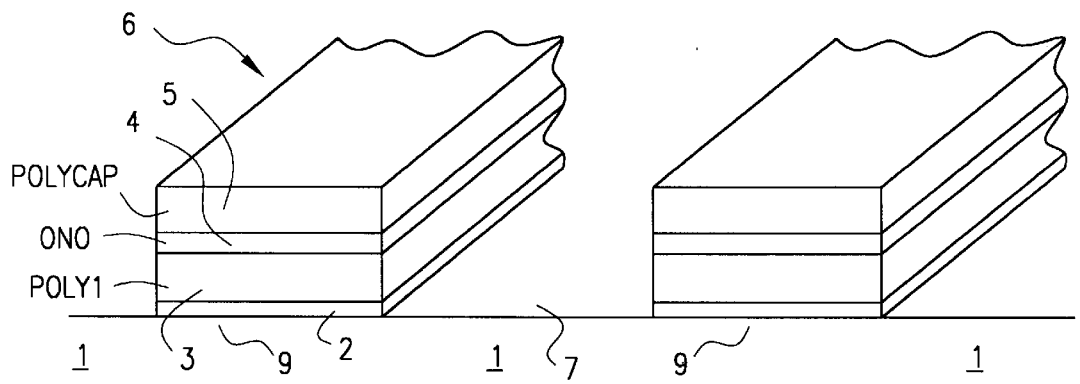
FIG. 3 is a perspective view, drawn to an enlarged scale, showing schematically an electronic device having a plurality of spaced bit lines integrated on a semiconductor substrate according to the present invention.
Figure 4:
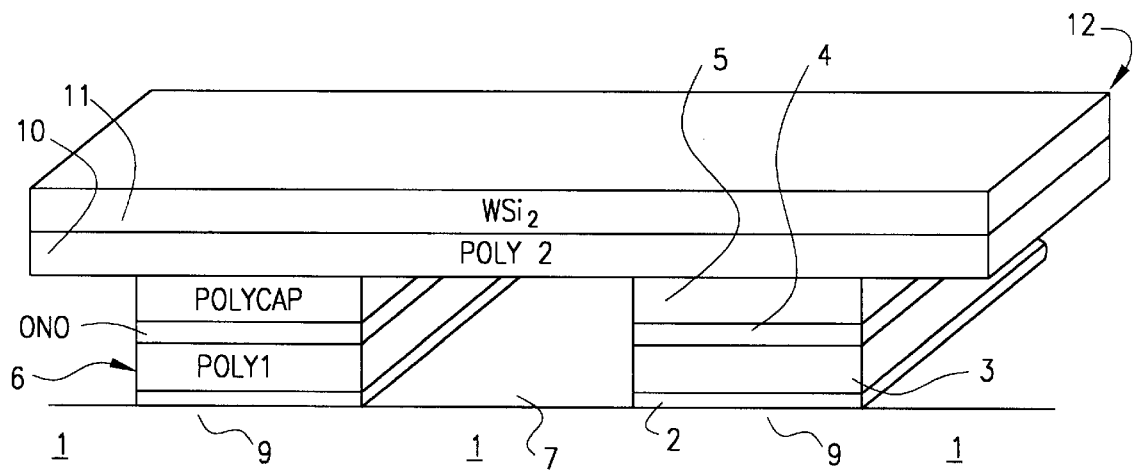
FIG. 4 is a perspective view, drawn to an enlarged scale, showing schematically an electronic device having a plurality of spaced bit lines which are integrated on a semiconductor substrate and which intersect a plurality of word lines according to the present invention.
Figure 5:
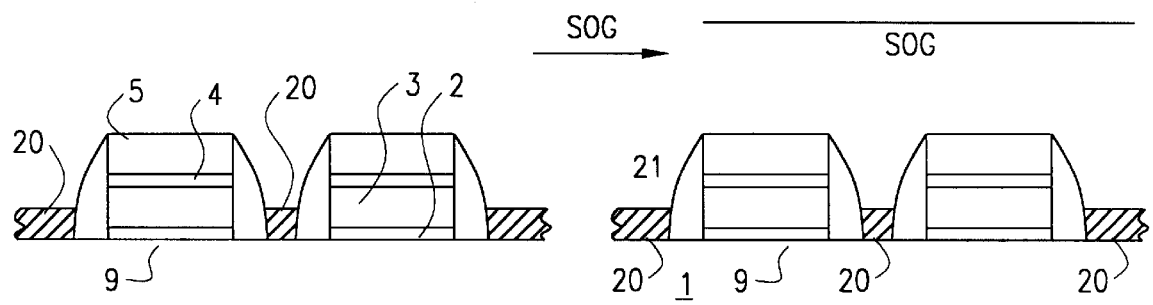
FIG. 5 is derived from a photograph, taken by an electronic microscope, of a plurality of bit lines integrated on a semiconductor substrate and isolated from one another by an oxide layer and the deposition of an overlying conductive layer according to the prior art.
Figure 5:
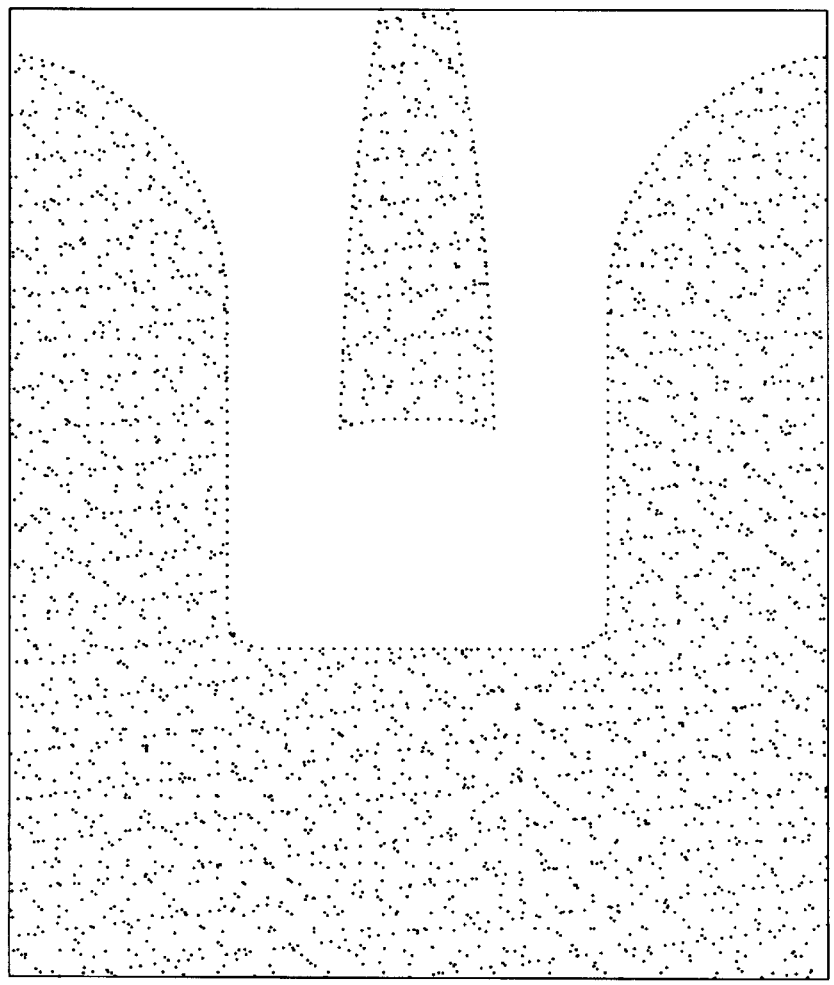

Generally, the present invention provides a method for the formation of a layered dielectric structure which planarizes the surface of a semiconductor whereon a circuit architecture is formed which includes bit lines or the like.

The invention particularly, but not exclusively, concerns a method of depositing a layered dielectric structure to improve the planarity of integrated electronic devices including EPROM or E²PROM memory cells, as identified by the intersections of bit lines and word lines, and the following description will make reference to this field of application for convenience of explanation only and not by means of limitation.

Referring now to FIGS. 7A and 7B, wherein reference numerals which are like, similar or identical to reference numerals in FIGS. 1, 2, 6A and 6B indicate like, similar or identical components, the method of the present invention provides for the deposition of a first dielectric layer 17, such as a silicon oxide deposited from a liquid or gaseous source. For example, this layer 17 may be of the TEOS type where deposited from a liquid source, or an oxide grown from a gaseous silane source under predetermined conditions to avoid the development of cracks or micro-voids.

The thickness of layer 17 is, for example, about 500 Å to 3,000 Å, enough to isolate the plurality of bit lines 6 from one another and fill the voids 7 therebetween.

Then, as shown in FIG. 7A, the deposition of a second dielectric layer 18 is effected to planarize the surface of the semiconductor substrate and fill the voids 7 between bit lines 6. This deposition step includes a preliminary sub-step of dispersing, i.e., spinning, a sol-gel or highly viscous liquid phase material, followed by a solidification process. The preferred material for use herein is a spin-on glass (SOG) comprising a mixture of siloxane including alkyl or aromatic organic compounds effective to stress-relieve the deposited film. In a preferred embodiment, a mixture of siloxane including methyl components is used. This solidification process, being more appropriately a densifying and branching process, will be referred to as "polymerization" hereinafter. However, it will be understood that the term "polymerization" shall not include any further limitations one may construe from use of the term.

Advantageously, the mixture is converted to a highly planarized and stable dielectric layer 18, as a result of thermal treatments being applied at a temperature of about 400° C. The thickness yielded by this polymerization is, for example, about 3,000 Å to 6,000 Å.

At this point, the second dielectric layer 18 is partly etched away using plasma techniques. This etching, as shown in FIG. 7B, is continued until each bit line 6 is partially exposed so as to restrict the second dielectric layer 18 to just the regions 7 between bit lines to form an electronic device 19. It has also been found experimentally that the selective etching by plasma techniques meets more strictly the above requirements when conducted by means of gas mixtures comprising carbon tetrafluoride ($CF_4$) and trifluoromethane ($CHF_3$).

The materials used thus far in the making of the dielectric layer 18 have a drawback in their low consistency with the substrate (doped, monocrystalline and/or poly silicon) due to the presence of organics. In fact, if the latter were to be subjected to thermal treatments at temperatures above 500° C., they could react during the densification step. This may specifically result in:

cracks being developed in the second layer 18 because of the film stress; and contaminants of the kind of C, H, HO, OH being potentially released which, by migrating into the semiconductor substrate, would degrade the electrical characteristics of the integrated device.

In order to stabilize the material of the second dielectric layer 18 and make it consistent with the process conditions, a rapid thermal annealing (RTA) or annealing treatment in an oven following the solidification step is performed according to the method of the present invention. It should be understood that the annealing in an oven would be applied for a longer time, but at a lower temperature, than the RTA treatment. This treatment is applied at a temperature preferably within the range of 700° C. to 850° C. under an oxygen stream. This allows organics present in the second dielectric layer 18 to be burned off and the layer densified.

The resulting second dielectric layer 18 has the same characteristics as a silicon oxide layer deposited by any of the LPCVD, PECVD and APCVD techniques. A refractive index value of approximately 1.46 is obtained therefor at a predetermined etching rate in an aqueous solution containing hydrofluoric acid HF. To verify the absence of organics from the second dielectric layer 18 exiting the rapid thermal annealing treatment, the two graphs shown in FIGS. 8 and 9 should be compared which represent an absorption spectrum IR associated with the second dielectric layer 18 before and after said thermal treatment, respectively.

Figure 8:
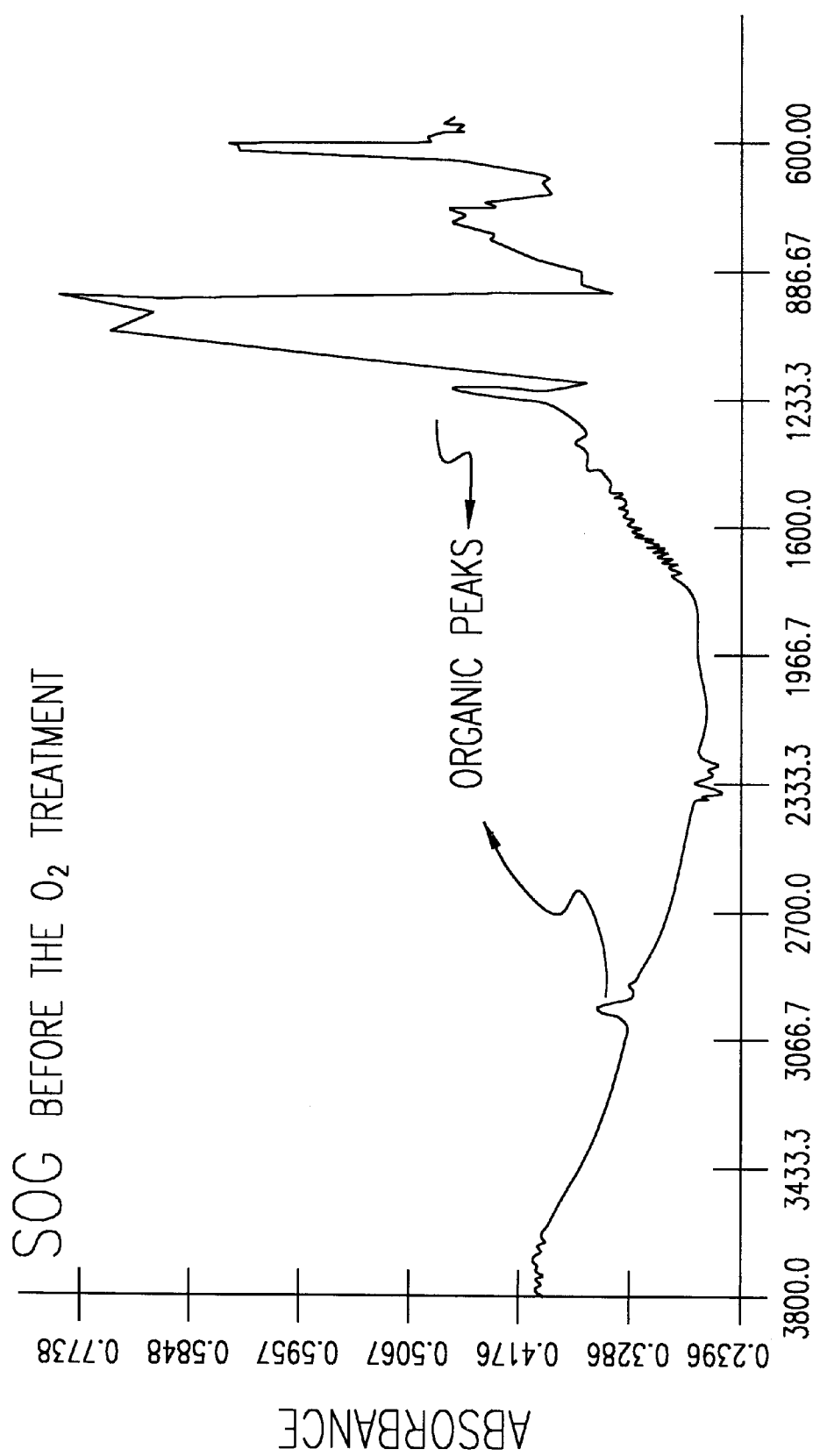
FIG. 8 shows a spectrum obtained at infrared wavelengths for a SOG dielectric layer prior to subjecting it to a rapid thermal annealing treatment in accordance with a method of the present invention.
Figure 9:
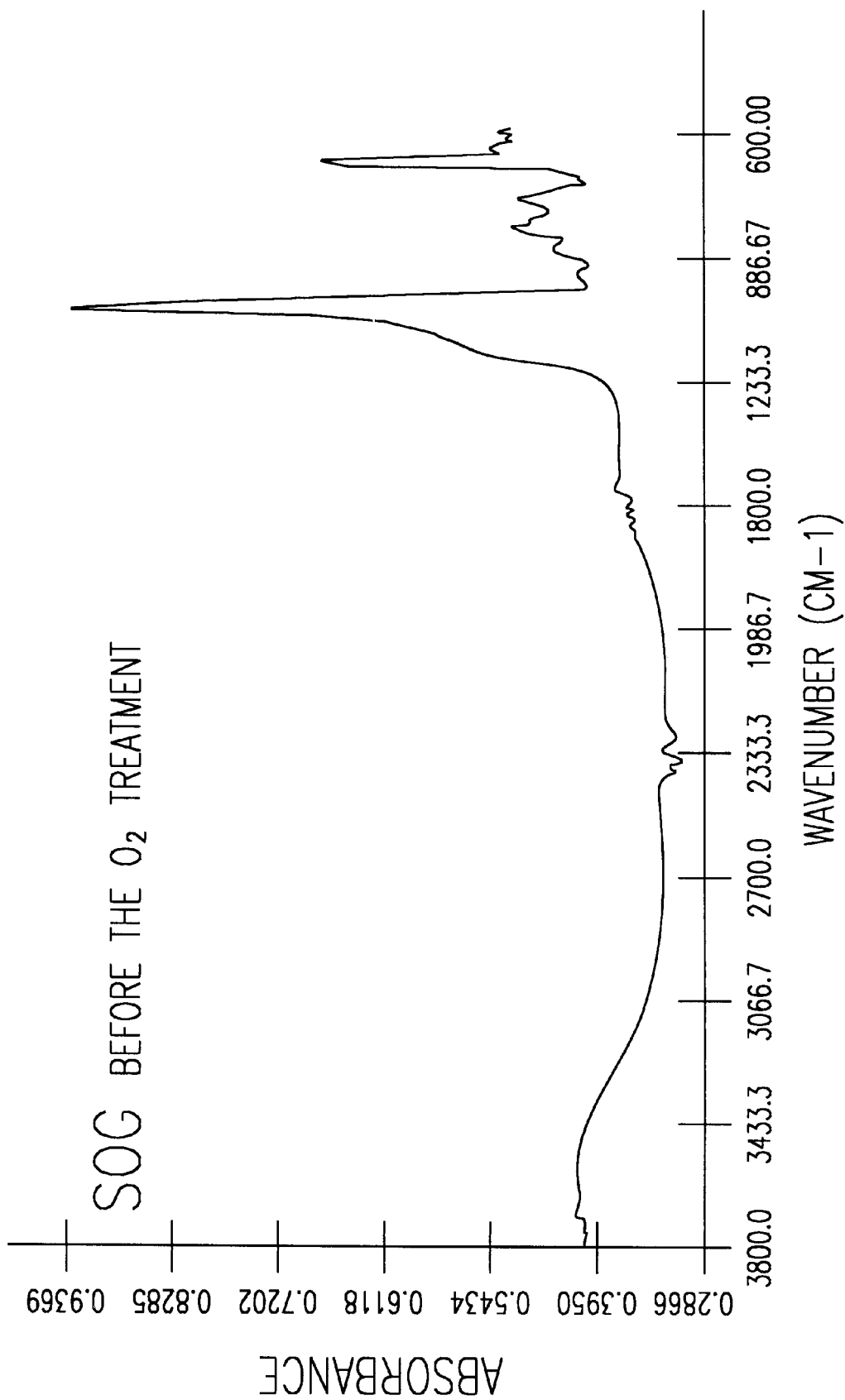
FIG. 9 shows a spectrum obtained at infrared wavelengths for a SOG dielectric layer after subjecting it to a rapid thermal annealing treatment in accordance with a method of the present invention.

It can be seen that the graph of FIG. 9 does not show two absorption peaks centered about the $1300[cm^{-1}]$ and $2900 [cm^{-1}]$ wavelengths indicating presence of the organic radical $CH_3$ in the dielectric layer under consideration, as shown in the graph of FIG. 8.

A technical expedient to improve the planarity levels of the semiconductor substrate, as obtained with the deposition method of this invention, is to have the bit lines 6 formed with determined thicknesses. In particular, it has been found experimentally that having a capping poly layer 5 deposited above the insulating ONO layer 4 to a thickness of 2,000 to 4,000 Å affords superior levels of planarity.

The method of the present invention allows a surface planarization to be achieved which makes the deposition possible, over a non-planar integrated architecture, of a conductive layer without breaks or shrinkages in the deposited film cross-section which, in turn, diminishes the reliability of the electronic device being formed.

FIGS. 10A and 10B illustrate another embodiment of the method of the present invention wherein reference numerals which are like, similar or identical to reference numerals in FIGS. 1, 2, 6A, 6B, 7A and 7B indicate like, similar or identical components. Here, the first dielectric layer 17 that is isolating the non-planarized architecture 8 is replaced, as shown in FIG. 10A, with an oxide layer 20 to be grown thermally on the overlying regions of the semiconductor substrate bounded by the bit lines 6. A SOG layer 21 is then applied as shown in FIG. 10B. This modification is meant to illustrate a further embodiment of the principles of this invention.

In particular, the possibility is shown of achieving comparable levels of planarity without resorting to dielectric oxide layers deposited by a chemical vapor deposition (CVD) technique, which are susceptible to cracking or pitting unless grown under determined conditions of pressure and temperature.

To summarize, the deposition method of the present invention allows the surface of semiconductor substrates to be planarized by filling the voids 7 on the order of 0.1 µm or more deep, in a way not possible with conventional CVD methods.

It should be further noted that the thermal treatments provided by the deposition method of the present invention are quite consistent with the integration of electronic devices with CMOS technology, since the amount of heat required to promote solidification and densification of the second, highly planarizing dielectric layer is quite small.

All of the above advantages brought about by the deposition method in accordance with the principles of the present invention can be recognized and ascertained by TEM and SEM analyses by an electronic microscope of semiconductor substrates having layered dielectric planarization structures which have been grown with the method of the present invention, and modifications thereof, described in the foregoing.

Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. A method of depositing a layered dielectric structure to improve the planarity of electronic devices integrated on a semiconductor substrate, which devices include a plurality of active elements having gate regions laid across the substrate as discrete parallel lines, said lines being isolated from one another by a first dielectric layer which also at least partially fills voids therebetween, said method comprising the steps of:

applying a second planarizing dielectric layer of spin-on glass (SOG);

solidifying the second dielectric layer by thermal polymerization treatments; and following the solidification step, etching and densifying the second dielectric layer with a rapid thermal annealing (RTA) treatment at a temperature approximately in the range of 700° C. to 850° C.

2. The deposition method according to claim 1, wherein the rapid thermal annealing treatment is applied in the presence of gaseous oxygen-containing mixtures.

3. The deposition method according to claim 1, wherein said etching is a plasma etching applied to remove the first and second dielectric layers such that the second dielectric layer is confined to the voids between said plurality of parallel lines.

4. The deposition method according to claim 1, wherein said first dielectric layer is an oxide which is deposited in a liquid phase.

5. The deposition method according to claim 4, wherein the thickness of said first dielectric layer is of 500 Å to 3,000 Å.

6. The deposition method according to claim 1, wherein the thickness of said second dielectric layer is of 1,000 Å to 6,000 Å.

7. A method of depositing a layered dielectric structure to improve the planarity of electronic devices integrated on a semiconductor substrate, which devices include a plurality of active elements having gate regions laid across the substrate as discrete parallel lines, said method comprising the steps of:

growing a first layer of dielectric oxide in the substrate regions between said lines;

dispersing or spinning from a liquid phase a highly viscous material, containing silicon oxides and organic radicals, to form a second planarized dielectric layer;

solidifying said second dielectric layer by thermal polymerization treatments;

selectively etching away at least a portion of said second dielectric layer; and densifying said second dielectric layer by a rapid thermal annealing treatment approximately in the range of 700° C to 850° C.

8. The deposition method according to claim 7, wherein said first layer of dielectric oxide is about 500 Å thick.

* * * * *